US010100430B2

(12) United States Patent
Hoshi et al.

(10) Patent No.: US 10,100,430 B2
(45) Date of Patent: Oct. 16, 2018

(54) METHOD FOR GROWING SILICON SINGLE CRYSTAL

(71) Applicant: SHIN-ETSU HANDOTAI CO., LTD., Tokyo (JP)

(72) Inventors: Ryoji Hoshi, Nishigo-mura (JP); Masanori Takazawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 478 days.

(21) Appl. No.: 14/420,806

(22) PCT Filed: Aug. 5, 2013

(86) PCT No.: PCT/JP2013/004719
§ 371 (c)(1),
(2) Date: Feb. 10, 2015

(87) PCT Pub. No.: WO2014/034028
PCT Pub. Date: Mar. 6, 2014

(65) Prior Publication Data
US 2015/0240380 A1    Aug. 27, 2015

(30) Foreign Application Priority Data

Aug. 28, 2012  (JP) .................................. 2012-187787

(51) Int. Cl.
*C30B 15/22*     (2006.01)
*C30B 29/06*     (2006.01)
(Continued)

(52) U.S. Cl.
CPC .............. *C30B 15/22* (2013.01); *C30B 15/14* (2013.01); *C30B 15/20* (2013.01); *C30B 15/206* (2013.01); *C30B 29/06* (2013.01)

(58) Field of Classification Search
CPC combination set(s) only.
See application file for complete search history.

(56) References Cited

U.S. PATENT DOCUMENTS

2003/0070605 A1    4/2003   Hoshi et al.
2005/0217570 A1*  10/2005   Shigeki .................. C30B 15/14
                                                              117/200
(Continued)

FOREIGN PATENT DOCUMENTS

JP       S64-24088 A       1/1989
JP       H04-160091 A      6/1992
(Continued)

OTHER PUBLICATIONS

Sep. 10, 2013 International Search Report issued in International Patent Application No. PCT/JP2013/004719.
(Continued)

*Primary Examiner* — Erin Flanagan Bergner
(74) *Attorney, Agent, or Firm* — Oliff PLC

(57) ABSTRACT

A method for growing a silicon single crystal by a Czochralski method, includes: conducting preliminary examination of growth conditions under which crystal collapse does not occur, the preliminary examination being based on a correlation between presence or absence of the crystal collapse in the silicon single crystal and a position at which an internal stress in the crystal when the silicon single crystal is grown will exceed a prescribed threshold, the position being away from a crystal growth interface; and growing the silicon single crystal in accordance with the growth conditions under which the crystal collapse does not occur, the growth conditions being determined from the preliminary examination. The method can grow a silicon single crystal while crystal collapse is effectively prevented.

11 Claims, 10 Drawing Sheets

(51) Int. Cl.
*C30B 15/20* (2006.01)
*C30B 15/14* (2006.01)

(56) References Cited

U.S. PATENT DOCUMENTS

2006/0272570 A1   12/2006   Hoshi et al.
2010/0258050 A1   10/2010   Hoshi et al.

FOREIGN PATENT DOCUMENTS

| JP | 2003-165791 A | 6/2003 |
| JP | 2005-132665 A | 5/2005 |
| JP | 2005-231969 A | 9/2005 |
| JP | 2006-213582 A | 8/2006 |
| JP | 2009-161416 A | 7/2009 |
| JP | 2010-175137 A | 8/2010 |
| JP | 2010-275137 A | 12/2010 |
| WO | 0157293 A1 | 8/2001 |

OTHER PUBLICATIONS

Materia Japan vol. 37 No. 12, P1018-1025 (1998).
Miyazaki, N. et al. "Thermal Stress Analysis of Silicon Bulk Single Crystal During Czochralski Growth". Journal of Crystal Growth, vol. 125, pp. 102-111, 1992.

\* cited by examiner (a)

(b)

INVERSION AREA (a)

(b)

(a)

(b)

(a)

(b)

(a)

(b)

(a)

(b)

METHOD FOR GROWING SILICON SINGLE CRYSTAL

TECHNICAL FIELD

The present invention relates to a method for growing a silicon single crystal by the Czochralski method (the CZ method), and more particularly to a method for growing a silicon single crystal of an N-region having a diameter of 300 mm or more.

BACKGROUND ART

In recent years, the enlargement of the diameter of silicon wafers in use for semiconductor devices has advanced to ensure the number of chips per area effectively. Silicon single crystals having, for example, a diameter of 450 mm are desired for the next generation, but not currently mass-produced. It is unclear what type of wafers will be a major type.

Wafers having a diameter of 300 mm, currently being used, are however required strictly to have high quality: standard wafers need to have at least defect-free portions near wafer surfaces on which devices operate. Examples of major wafers to meet this requirement include epitaxial wafers, annealed wafers, defect-free (N-region) crystal polished wafers (PW).

Among them, the epitaxial wafer and annealed wafer have relatively wide margin for manufacture at the time of crystal growth even if defects are formed during the crystal growth, because defects near a surface layer are removed by formation of an epitaxial layer or annealing.

For the defect-free crystal PW, which is obtained by merely growing a defect-free crystal and polishing the crystal, growth conditions that enable a defect-free crystal to be grown need be achieved.

Defect-free crystals are obtained by holding the ratio V/G of a growth rate V to a temperature gradient G near the crystal growth interface at a constant value. These crystals are also obtained by controlling the value V/G so as to be constant in a crystal growth plane.

It is, however, very difficult to control the value V/G completely so as to be constant in the plane, so it is necessary to have the so-called margin for manufacture, which allows manufacture even when the value V/G slightly changes.

Patent Document 1 discloses a method of increasing the margin for manufacture: it is useful to rapidly cool a crystal. According to this method, a 7% margin for manufacture, which is sufficient for industrial manufacture, can be maintained.

Patent Document 2 discloses a technology of using a cooling cylinder and an auxiliary cooling cylinder, used as a rapid cooling means, in a CZ single crystal manufacturing apparatus. Patent Document 3 discloses a means for improving cooling capacity by improving the adhesiveness of an auxiliary cooling cylinder. It is obvious that rapid cooling of crystals with these technologies allows defect-free crystals to be obtained more easily.

Silicon single crystals having a diameter of 450 mm however have longer distance from the center than do those having a diameter of 200 mm or 300 mm, which are currently major, and hence difficulty in cooling its central portion. It is necessary for the 450-mm-diameter crystals to improve the cooling effect in comparison with the 200- or 300-mm-diameter crystals in order to raise the cooling rate at the central portion to the same level as the 200- or 300-mm-diameter crystals. The additional improvement of the cooling effect thus makes the internal stress of the crystals larger. The larger internal stress may cause problems such as crystal collapse during growth.

In view of these problems, Patent Document 4 discloses the inhibition of stress at the growth interface for prevention of crystal collapse. The conditions used therein, however, cannot be normally used because dislocations are generated in crystals before the crystal collapse. Moreover, Patent Document 5 is characterized by a thermal stress value of less than 40 MPa in a temperature range of 900° C. to 1100° C., but this condition is not sufficient.

CITATION LIST

Patent Literature

Patent Document 1: Japanese Unexamined Patent publication (Kokai) No. 2005-132665
Patent Document 2: International Publication WO01/057293
Patent Document 3: Japanese Unexamined Patent publication (Kokai) No. 2009-161416
Patent Document 4: Japanese Unexamined Patent publication (Kokai) No. 2003-165791
Patent Document 5: Japanese Unexamined Patent publication (Kokai) No. 2006-213582

Non Patent Literature

Non Patent Document 1: Materia Japan Vol. 37 No. 12 P1018-1025(1998)

SUMMARY OF INVENTION

Technical Problem

The present invention was accomplished in view of the above-described problems. It is an object of the present invention to provide a method that can grow a silicon single crystal while crystal collapse is effectively prevented.

Solution to Problem

To achieve this object, the present invention provides a method for growing a silicon single crystal by a Czochralski method, comprising: conducting preliminary examination of growth conditions under which crystal collapse does not occur, the preliminary examination being based on a correlation between presence or absence of the crystal collapse in the silicon single crystal and a position at which an internal stress in the crystal when the silicon single crystal is grown will exceed a prescribed threshold, the position being away from a crystal growth interface; and growing the silicon single crystal in accordance with the growth conditions under which the crystal collapse does not occur, the growth conditions being determined from the preliminary examination.

In this way, since the above correlation between presence or absence of the crystal collapse in the silicon single crystal and the position away from the crystal growth interface at which the internal stress in the crystal, which depends on crystal growth conditions, will exceed a prescribed threshold is previously investigated, conditions under which the crystal collapse occurs can be found. Since the growth conditions under which the crystal collapse does not occur are preliminarily examined on the basis of the correlation and determined for growth, the silicon single crystal can be grown while the crystal collapse is more reliably prevented than does a conventional method.

The prescribed threshold, described herein, can be determined properly in consideration of, for example, the result of past data as to the crystal collapse, oxygen concentration, and so on as described later.

Moreover, the prescribed threshold may be $1.27 \times 10^4 \exp(10170/T)$, where T is a crystal temperature (K).

Use of this threshold enables the correlation to be readily and effectively obtained, thereby enabling the silicon single crystal to be grown without the crystal collapse.

Moreover, the silicon single crystal can be grown while a temperature gradient (G) of a central portion of the crystal near the crystal growth interface is equal to or more than $350/r$ (K/mm), where r is a crystal radius.

When an N-region single crystal is grown, for example, it is useful to rapidly cool the crystal to increase the margin for manufacture as above. Accordingly, the present invention grows the crystal under rapid cooling that keeps the above temperature gradient while preventing the crystal collapse, thereby enabling the manufacture of an N-region single crystal with a sufficient margin for manufacture. In addition, since the condition for manufacturing an N-region single crystal is that the ratio V/G of a crystal growth rate V to a temperature gradient G is held at a fixed condition, if the temperature gradient G is larger, the growth rate V can also be larger, so the productivity can be improved. A larger temperature gradient G permits a faster crystal growth rate, not only in growth of an N-region crystal, but also in rapid crystallization, thereby enabling improvement in the productivity.

The temperature gradient G, described here, may be determined, for example, in the range between the melting point of silicon (1412° C.) and 1400° C.

Moreover, the silicon single crystal may have a diameter of 300 mm or more.

The present invention is particularly useful for growing a crystal having a large diameter, which has difficulty in cooling the interior of the crystal and is easy to collapse, more specifically, a silicon single crystal having a diameter of 300 mm or more, further 450 mm or more.

Moreover, the silicon single crystal can be grown with a growing apparatus comprising a cooling cylinder configured to surround the silicon single crystal and to forcibly cool the silicon single crystal with a cooling medium and an auxiliary cooling cylinder disposed so as to contact the cooling cylinder, the auxiliary cooling cylinder surrounding the silicon single crystal, and the growth conditions include a position of a lower end of at least one of the cooling cylinder and the auxiliary cooling cylinder.

In this way, the growth conditions under which the crystal collapse does not occur can be readily achieved.

Moreover, the cooling cylinder can be made of a metal selected from a group consisting of iron, chromium, nickel, copper, titanium, molybdenum, and tungsten, or an alloy containing the metal, or the metal or the alloy coated with titanium, molybdenum, tungsten, or platinum metal.

Use of the material of this type makes the cooling cylinder versatile and easy to handle, enabling stable cooling capacity to be maintained even at a high temperature.

Moreover, the auxiliary cooling cylinder can be made of a metal selected from a group consisting of a graphite material, a carbon composite, stainless steel, molybdenum, and tungsten and has a slit that axially penetrates.

Use of the material of this type provides high thermal conductivity and high emissivity and makes the auxiliary cooling cylinder easy to absorb heat from the crystal. In addition, the slit allows the auxiliary cooling cylinder to come into close contact with the cooling cylinder due to thermal expansion, so heat transfer capability improves.

Moreover, the silicon single crystal can be grown in such a manner that a cooling rate is 0.96° C./min or more when the temperature is decreased from a melting point of silicon to 950° C., the cooling rate is 0.88° C./min or more when the temperature is decreased from 1150° C. to 1080° C., and the cooling rate is 0.71° C./min or more when the temperature is decreased from 1050° C. to 950° C.

In this way, the growth of defects such as void defects, OSF nuclei, and interstitial defects can be inhibited, and the margin for manufacture of an N-region single crystal can be widened.

Advantageous Effects of Invention

As described above, the inventive method for growing a silicon single crystal can grow the silicon single crystal while more reliably preventing crystal collapse.

DESCRIPTION OF EMBODIMENTS

Figure 1:
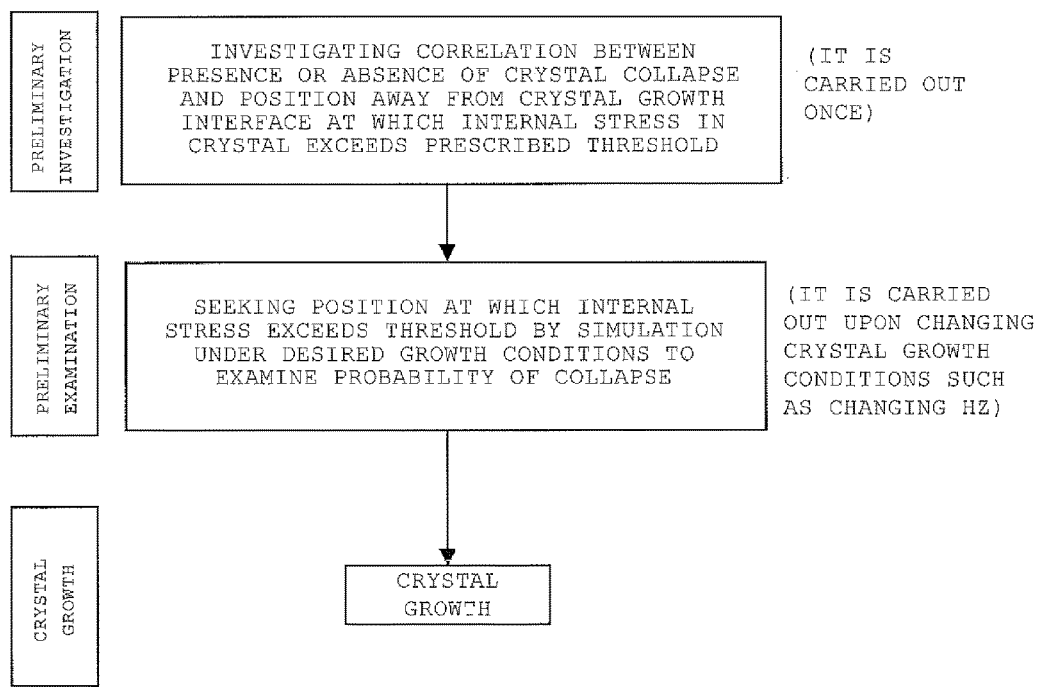
FIG. 1 is a flowchart of an example of the steps of the inventive method for growing a silicon single crystal.

Hereinafter, embodiments of the present invention will be described in detail with reference to the drawings, but the present invention is not limited to these embodiments.

Now how the present inventors have completed the present invention will be described in detail.

In view of the above-described problems, the inventors diligently studied crystal collapse.

As shown in Non Patent Document 1, a portion having a temperature between the melting point and about 600° C. in a silicon crystal is called a plastic-deformation region, where plastic deformation may occur due to the slip of dislocation; a portion having a temperature lower than that temperature is a region where brittle fracture due to cleavage may mainly occur.

When a stress-strain curve in a plastic deformation region having more than a temperature of 600° C. is found by a deformation test, a bend point appears in transition between an elastic deformation region and the plastic deformation region. This point is a yield point; a stress at this point is a yield stress. When a stress equal to or more than the yield stress is applied to the plastic deformation region, dislocations are slipped and crystal is thereby deformed.

Non Patent Document 1 states that the yield stress strongly depends on temperature and rapidly increases at lower temperatures; accordingly the resistance to a stress is higher at a portion having a lower temperature; and the yield stress of dislocation-free crystals is independent of oxygen concentration, whereas that of crystals having dislocations is dependent on oxygen concentration of the crystals and increases as the oxygen concentration increases.

Considering a crystal in the course of growth on the basis of these statements, the phenomenon of the generation of dislocations in a crystal is irrelevant to oxygen concentration, but when dislocations are generated, the stress that causes plastic deformation due to the slip of the dislocations depends on oxygen concentration.

The stress that generates dislocations will now be considered. The ideal strength of a silicon crystal, which is calculated from its interatomic force etc., is very large, such as 13.7 GPa. In fact, however, the yield stress is lower than this strength. The reason is considered to be impurities, defects, and so on.

As this consideration is applied to a crystal in the course of growth, if the crystal is nearly perfect, dislocations are not generated only due to a thermal stress. In practice, however, CZ crystals contain oxygen atoms and dopant in use for resistivity control. In operation where the crystal growth interface is located higher and hence the internal stress at a central portion of the crystal is larger, such as high-rate growth, dislocations may be generated from a central portion of the growth interface. In this case, the stress varies depending on the type and concentration of impurities. It is understood that these dislocations are generated by an unendurable stress thermally produced, even though proper atomic arrangement is maintained during growth.

Typical dislocations that are mainly generated do not begin at the central portion of the crystal growth interface due to the internal stress of this type, but are induced from an irregular location such as the exterior of a crystal. It is accordingly understood that the existence of impurities, insoluble matter, solidification, and the like disturbs the atomic arrangement during growth, thereby generating the dislocations. In other words, the dislocations are relatively easily generated due to insoluble matter etc., irrespective of the ideal strength.

In order to avoid crystal collapse, it is accordingly important to prevent the plastic deformation due to the slip of the generated dislocations from progressing rather than prevent the generation of dislocations.

Dislocations are easy to slip under a stress exceeding the yield strength. If the internal stress calculated from temperature distribution in a crystal exceeds the yield stress at the temperatures, the dislocations are therefore easy to slip within the temperature range. When this range is large, the crystal collapse may occur. More precisely, the stress concerning the slip of dislocations is a resolved shear stress, which is obtained by projecting a stress in a deformation test on a slip plane in the direction of the slip. Accordingly, the yield stress, described here, more precisely represents the critical resolved shear stress.

In view of the above consideration, the present inventors studied an internal stress at a crystal position in a grown silicon single crystal and a prescribed threshold corresponding to the critical resolved shear stress at the crystal position. The inventors consequently found that there is a correlation between presence or absence of the crystal collapse and a position away from the crystal growth interface at which the internal stress exceeds a prescribed threshold. It is to be noted that an area in which the internal stress exceeds a prescribed threshold is called an inversion area. Naturally, the value of the position at which the internal stress exceeds a prescribed threshold is determined depending on crystal growth conditions. The inventors also found that preliminary examination with this correlation more reliably and simply enables the growth of a silicon single crystal without crystal collapse, thereby bringing the present invention to completion.

The inventive method for growing a silicon single crystal will be described below in detail.

A CZ silicon single crystal manufacturing apparatus that can be used in the inventive method will now be described. As described in FIG. 2, the CZ silicon single crystal manufacturing apparatus 1 includes components for containing and melting a polycrystalline silicon raw material, a heat insulator for shielding heat, and other components. These components are accommodated in a main chamber 2. The ceiling of the chamber 2 is connected with a pull chamber 3 extending upward. A mechanism (not shown) for pulling a silicon single crystal 4 with a wire 5 is provided at the upper part of the pull chamber 3.

In the main chamber 2, a quartz crucible 7 for containing a raw material melt 6 and a graphite crucible 8 for supporting the quartz crucible 7 are provided. These crucibles 7 and 8 are supported by a crucible shaft 9 and are capable of rotating and moving upward and downward with a driving mechanism (not shown).

A graphite heater 10 for melting the raw material is disposed so as to surround the crucibles 7 and 8. A heat insulator 11 is disposed outside the graphite heater 10 so as to surround its periphery.

A gas inlet 12 is disposed at an upper portion of the pull chamber 3. An inert gas such as an argon gas is introduced therefrom and discharged through a gas outlet 13 disposed at a lower portion of the main chamber 2.

A shielding member 14 is provided so as to face the raw material melt 6, so radiation from the surface of the raw material melt 6 is cut and the temperature of the surface of the raw material melt 6 is maintained.

Moreover, a cooling cylinder 15, a cooling medium inlet 16, an auxiliary cooling cylinder 17 are provided.

The cooling cylinder 15 in this embodiment is cylinder and extends from the ceiling of the main chamber 2 toward the surface of the raw material melt 6 so as to surround the single crystal 4 during pulling. A cooling medium is introduced into the cooling cylinder 15 from the cooling medium inlet 16, circulates through the cooling cylinder 15 to forcibly cool the cooling cylinder 15, and is then discharged to the exterior.

The cooling cylinder 15 may be made of, for example, iron, chromium, nickel, copper, titanium, molybdenum, or tungsten, or an alloy containing the metal. The metal or the alloy may be coated with titanium, molybdenum, tungsten, or platinum metal.

In particular, stainless steel (SUS), an alloy of iron, chromium and nickel, is versatile and easy to use. Use of the cooling cylinder made of the material of this type enables a stable cooling effect to be maintained even under high temperatures.

The auxiliary cooling cylinder 17 is fitted into the interior of the cooling cylinder 15. The auxiliary cooling cylinder 17 in this embodiment is cylinder and configured to surround a high-temperature portion of the silicon single crystal 4 that has just been pulled.

Changing the location, the shape etc., of the auxiliary cooling cylinder 17 allows each temperature zone to be rapidly cooled in a controllable manner at a desired cooling rate when the single crystal is pulled.

The auxiliary cooling cylinder 17 is preferably made of a material that is stable at high temperatures and has high thermal conductivity, such as a graphite material, a carbon composite, stainless steel, molybdenum, and tungsten. In particular, graphite material is more preferable, because it has high thermal conductivity and high emissivity and easily absorbs heat from the crystal.

When the auxiliary cooling cylinder has a slit that axially penetrates, the auxiliary cooling cylinder can come into close contact with the cooling cylinder due to thermal expansion, so its heat transfer capability can be improved.

FIG. 1 shows a flowchart of the steps of the inventive method. As shown in FIG. 1, the method includes preliminary investigation, preliminary examination, and crystal growth.

In the preliminary investigation, the correlation between presence or absence of the crystal collapse in a silicon single crystal and the position away from the crystal growth interface at which the internal stress in the crystal when the silicon single crystal is grown will exceed a prescribed threshold is investigated.

Then, the growth conditions under which the crystal collapse does not occur are preliminarily examined on the basis of the correlation obtained in the preliminary investigation, for example, through simulations.

The silicon single crystal is grown in the growth conditions under which the crystal collapse does not occur, which has been obtained from the preliminary examination.

Each step will be described below in more detail.
(Preliminary Investigation)

First, the correlation between presence or absence of the crystal collapse and the position away from the crystal growth interface at which the internal stress in the crystal when the silicon single crystal is grown will exceed a prescribed threshold is investigated. Once crystal growth conditions are selected, temperature distribution in the crystal can be obtained by a simulation such as FEMAG or another simulation. The internal stress and the threshold can be calculated from the temperature distribution, so the position at which the internal stress exceeds the threshold can be obtained.

The procedures of the investigation itself are not particularly limited; for example, it is practical for single crystal manufacturing makers to conduct investigation from results of past data that has already stored. The investigation may also be conducted from growth data obtained by growing a plurality of silicon single crystals under various crystal growth conditions with various CZ silicon single crystal manufacturing apparatuses.

In this investigation, the defect region and the diameter etc., of the silicon single crystal to be grown are not limited and appropriately determined; for example, the defect region and the diameter may be the same as does a desired silicon single crystal to be grown in a main test.

The present invention, needless to say, is effective for operations not only where the internal stress is large such as high-rate growth but also where the crystal is rapidly cooled such as N-region single crystal growth. This is because the invention can more reliably prevent the crystal collapse even in the conditions under which the internal stress in the crystal is so large due to rapid cooling that the crystal collapse is likely to occur.

The silicon single crystal may have a large diameter of 300 mm or more. Although the large diameter makes it difficult to cool the crystal center and easy to collapse the crystal, the present invention can reliably prevent the collapse from occurring in this situation.

The internal stress in the crystal at this time can be calculated, for example, with simulation software, FEMAG. In this embodiment, the Young's modulus is 156 GPa, the Poisson's ratio is 0.25, and the linear expansion coefficient is $5.2 \times 10^{-6}$(/K).

The prescribed threshold is not particularly limited and appropriately determined.

In this embodiment, the threshold is expressed as $\alpha \exp(\beta/T)$, where T is a crystal temperature (K), and corresponds to the critical resolved shear stress (CRSS); the threshold is determined as $1.27 \times 10^4 \exp(10170/T)$ from the results of past data.

More specific value is one third of a CRSS of $3.82 \times 10^4 \exp(10170/T)$ disclosed by Miyazaki etc., (N. Miyazaki et. al. J. Crystal Growth 125 (1992) 102-111). As disclosed in Non Patent Document 1, since the yield stress obtained by a deformation test varies depending on various conditions, the inventors' experience of the crystal collapse was taken into account to determine one third of the value.

The above values $\alpha$ and $\beta$ ($1.27 \times 10^4$ and 10170), however, must vary depending on impurities, particularly oxygen concentration. These values was determined from a documentary value and an experiential value of the yield stress obtained by a deformation test on a CZ crystal, where the oxygen concentration was about $(12.0 \pm 2.5) \times 10^{17}$ atoms/cm$^3$(ASTM'79). When the oxygen concentration is larger than this value, the values $\alpha$ and $\beta$ may be larger; when the oxygen concentration is lower than this value, the values $\alpha$ and $\beta$ may be smaller.

The values $\alpha$ and $\beta$ can also vary depending on calculation conditions concerning the internal stress such as the Young's modulus, as above.

With regard to presence or absence of the crystal collapse and the growth conditions, it suffices to check whether or not the crystal collapse occurred and the growth conditions at that time by referring to past data (or actual growth for the preliminary investigation).

Figure 2:
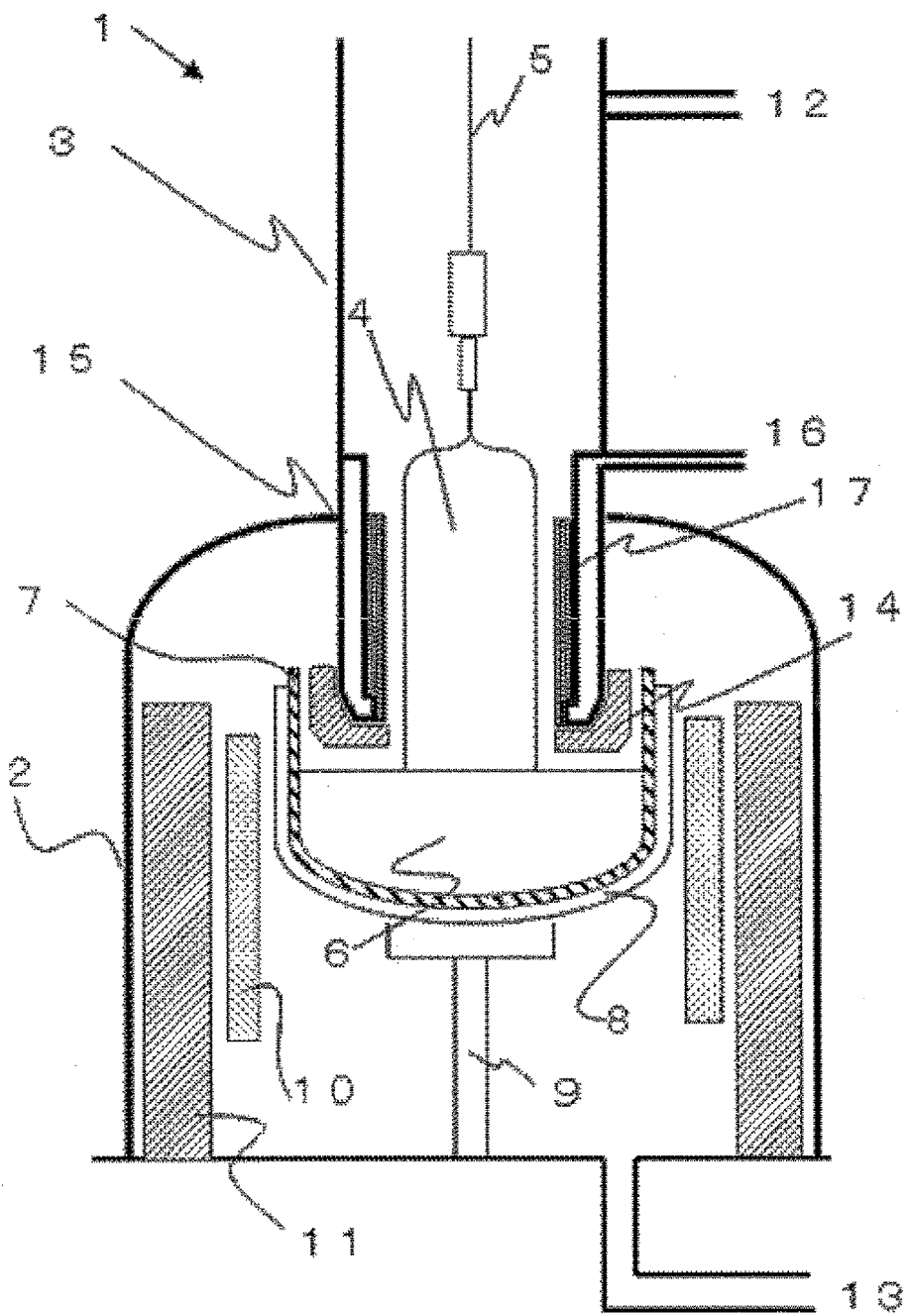
FIG. 2 is a schematic diagram of an exemplary CZ silicon single crystal manufacturing apparatus.

Examples of the growth conditions include the position of the lower end of at least one of the cooling cylinder and the auxiliary cooling cylinder, shown in FIG. 2.

In the CZ silicon single crystal manufacturing apparatus 1 arranged as shown in FIG. 2, the silicon single crystal 4 being grown is surrounded by the water-cooled cooling cylinder 15 and the auxiliary cooling cylinder 17 cooled by contact with the cooling cylinder 15, so heat transfer due to radiation is promoted to efficiently cool the crystal.

The silicon single crystal 4 is then rapidly cooled within the range above the height position corresponding to the lower end of the disposed cooling cylinder 15 or auxiliary cooling cylinder 17. As seen from the above expression of the threshold, the threshold drastically increases as the temperature decreases, and the resistance to the stress within the range above the above-described height, away from the crystal growth interface, can be significantly increased. In other words, it can be said that the position of each lower end is one parameter that affects the threshold, the actual internal stress, and the size of the above inversion area.

The correlation will be described in more detail.

The simulation result of a general case where the crystal collapse does not occur will now be introduced. Global heat transfer analysis software, FEMAG, was used as the software of the simulation.

Figure 3:
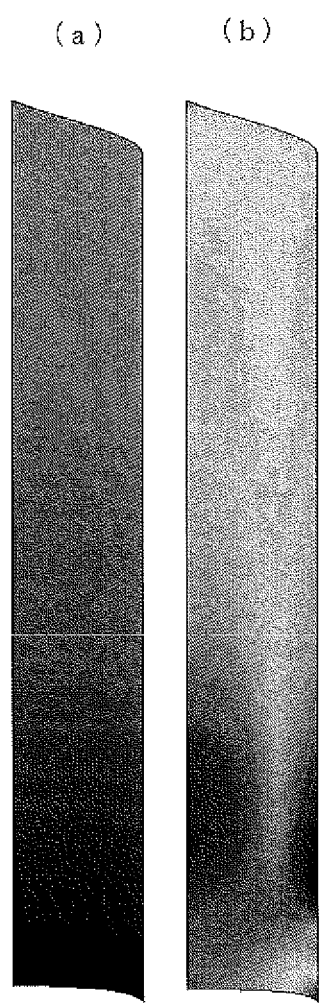
FIG. 3(a) is a schematic diagram of a common temperature distribution in a crystal shown in preliminary examination, and 3(b) is a schematic diagram of an internal stress distribution.

The temperature distribution in a crystal was calculated; consequently the temperature distribution was obtained as shown in FIG. 3(*a*). The von Mises equivalent stress calculated as the internal stress from the distribution is shown in FIG. 3(*b*). These drawings are represented such that the black color becomes darker as the temperature is higher or the stress is larger.

The Young's modulus used when the stress was calculated was 156 GPa, the Poisson's ratio was 0.25, and the linear expansion coefficient was $5.2 \times 10^{-6}$(/K).

As seen from FIG. 3(*b*), the stress is larger at the central portion of the crystal or the peripheral portion of the crystal, when the drawing is seen in a lateral direction. The outline of the internal stress in the crystal can therefore be grasped by an axial profile of the center and the periphery of the crystal.

Figure 4:
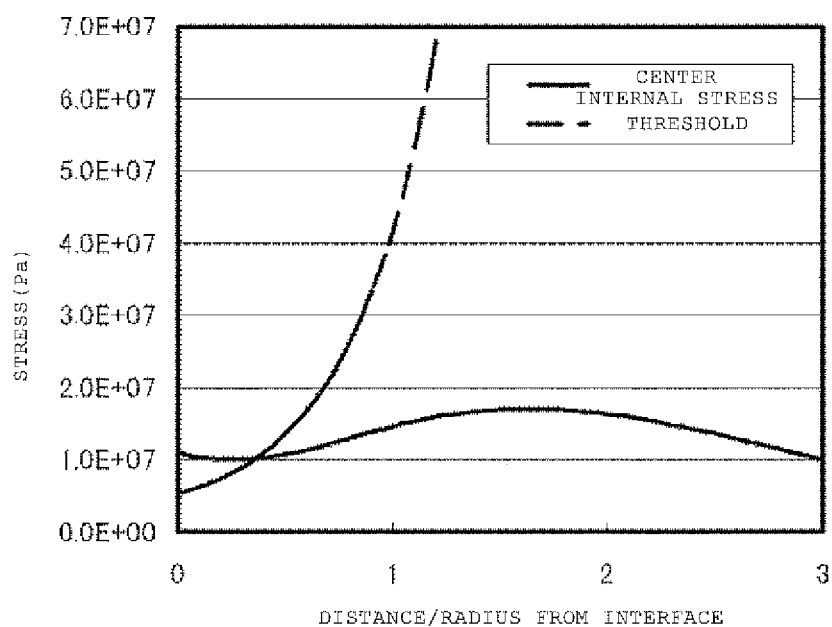
FIG. 4 are graphs on which axial distributions of common internal stress in a crystal and a threshold in preliminary examination are plotted, where (a) shows a distribution of the center of the crystal and (b) shows a distribution of the periphery of the crystal.
Figure 4:
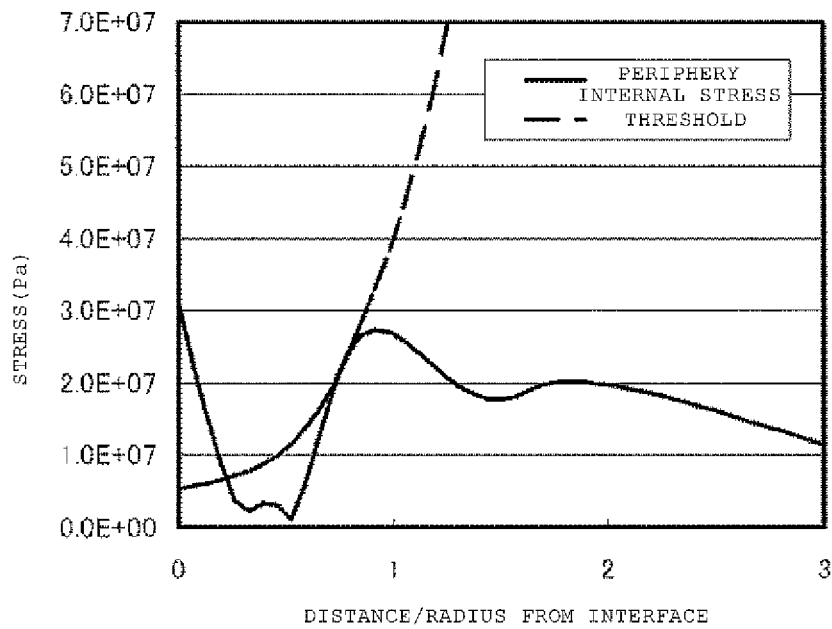

FIG. 4 are drawings in which the stress is plotted with respect to the position (distance) away from the crystal growth interface; the position is standardized by a crystal radius r, where FIG. 4(*a*) shows a plot for the crystal center; FIG. 4(*b*) shows a plot for the crystal periphery. In FIG. 4, the threshold of $1.27 \times 10^4 \exp(10170/T)$ at the temperature is also plotted as a dotted line, where T is a crystal temperature (K).

As the distance from the crystal growth interface increases, the temperature decreases and thereby the threshold drastically increases. It can be seen that the internal stress exceeds the threshold at the vicinity of the crystal growth interface (inversion area).

In this case, however, the inversion area is limited to below 0.36 r for the center and 0.78 r for the periphery, and does not reach 1 r. For the periphery, although a small inversion area exits at 0.78 r, the stress at the range from 0.20 r to 0.78 r is below the threshold; dislocations are thereby difficult to slip. Even if dislocations are generated for some reason, since the area where the internal stress exceeds the threshold is small, the crystal collapse due to the slip of dislocations does not occur.

Figure 5:
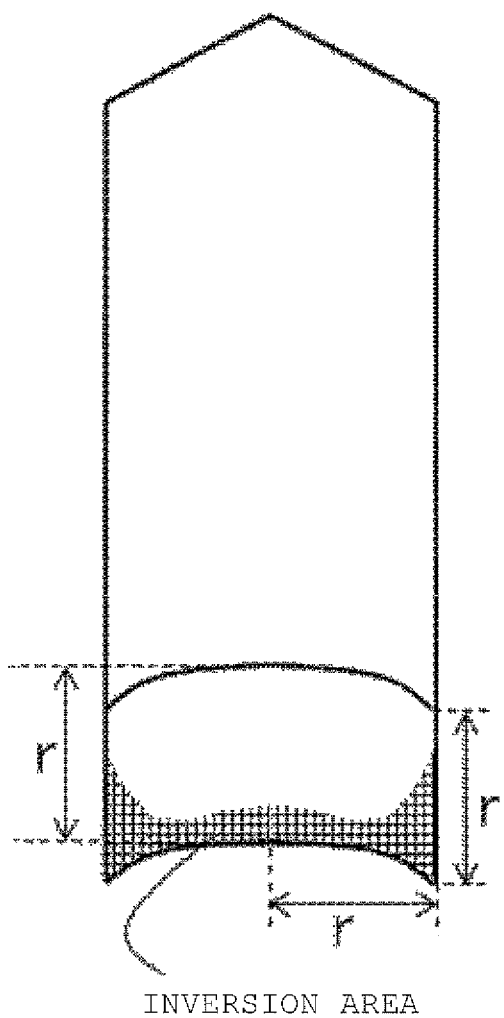
FIG. 5 is a schematic diagram of an inversion area.

FIG. 5 shows a schematic diagram of an inversion area. This diagram shows an example in which the inversion area does not reach a position 1 r away from the crystal growth interface and the crystal collapse does not occur.

In addition, the cases where the crystal collapse occurred during crystal growth were collected. Two cases were given, excepting exemplary collapses due to apparently other reasons such as the collision of a crystal by earthquake shaking. The conditions in two cases are referred to as condition A and condition B. The situation when the collapse occurred was simulated.

Figure 6:
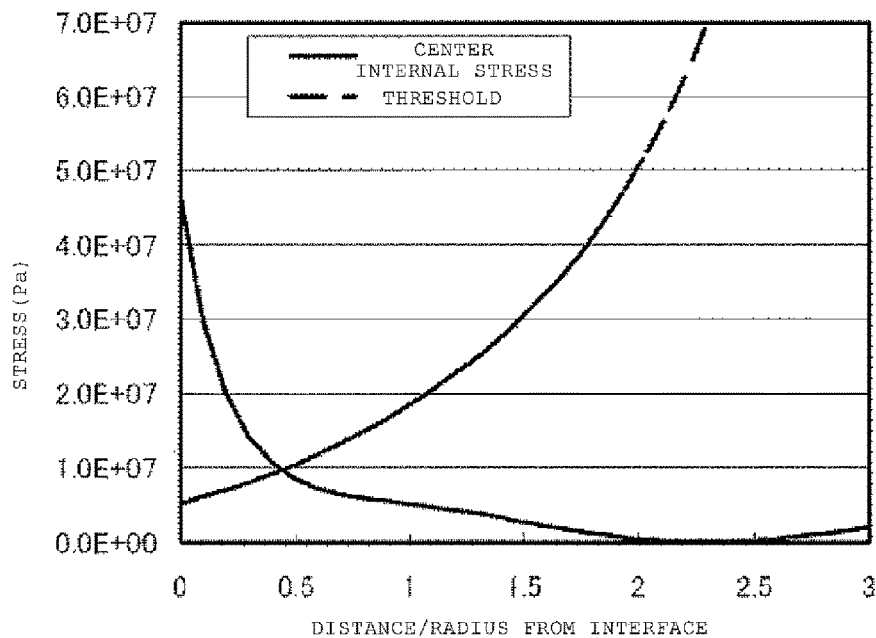
FIG. 6 are graphs on which axial distributions of internal stress in a crystal that was collapsed and a threshold in preliminary examination are plotted, where (a) shows a distribution of the center of the crystal and (b) shows a distribution of the periphery of the crystal.
Figure 6:
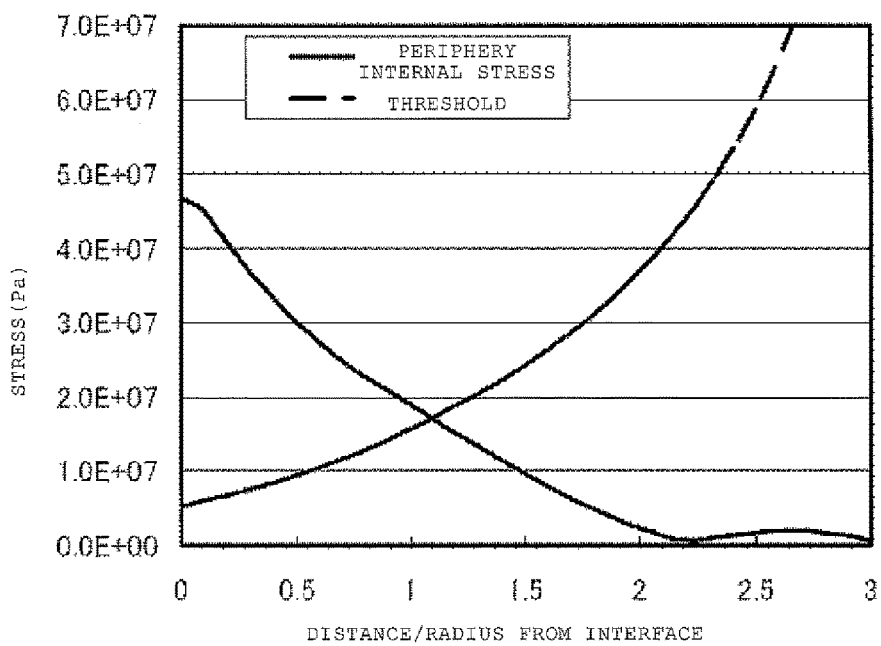

FIG. 6 shows the result of the simulation of the crystal collapse under condition A. As in FIG. 4, FIG. 6(*a*) shows the internal stress distribution and the threshold at the crystal center; FIG. 6(*b*) at the crystal periphery.

The target oxygen concentration of the crystal was $(12.8 \pm 1.6) \times 10^{17}$ atoms/cm$^3$(ASTM'79). The reason why the target oxygen concentration is described here instead of the actual oxygen concentration is that the oxygen concentration was not able to be measured due to the crystal collapse.

As seen in FIG. 6(*b*), the inversion area where the internal stress exceeds the threshold spreads up to 1.09 r. In sum, it can be understood that when dislocations are generated for some reason, since dislocations are easy to slip in the area where the internal stress exceeds the threshold, the slip occurs in multiple locations, leading to plastic deformation of the crystal and finally the crystal collapse.

Figure 7:
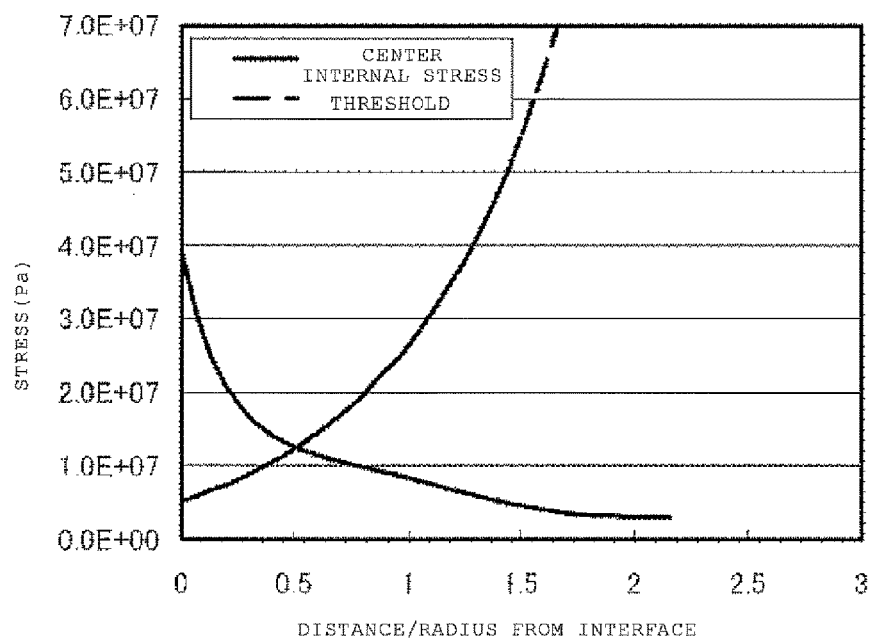
FIG. 7 are graphs on which axial distributions of internal stress in another crystal that was collapsed and a threshold in preliminary examination are plotted, where (a) shows a distribution of the center of the crystal and (b) shows a distribution of the periphery of the crystal.
Figure 7:
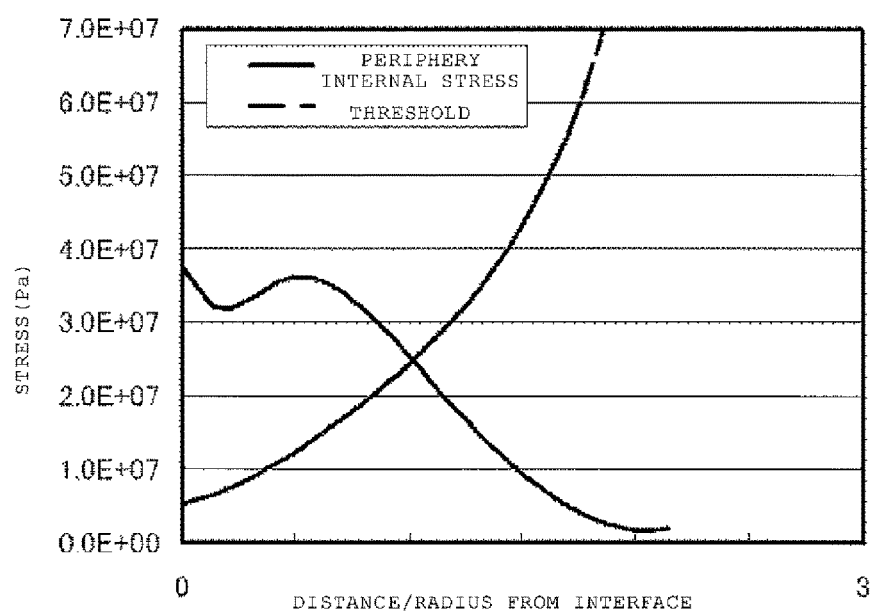

FIG. 7 shows likewise the result of the simulation of the crystal collapse under condition 3. As in FIG. 4, FIG. 7(*a*) shows the internal stress distribution and the threshold at the crystal center; FIG. 7(*b*) at the crystal periphery.

The target oxygen concentration of the crystal was $(11.2 \pm 1.6) \times 10^{17}$ atoms/cm$^3$(ASTM'79). The crystal was collapsed when its length was short (a crystal length of about 2.3 r).

As seen in FIG. 7(*b*), the inversion area where the internal stress exceeds the threshold spreads up to 1.01 r, also in this case. In sum, it can be understood that when dislocations are generated for some reason, since the dislocations are easy to slip in the area where the internal stress exceeds the threshold, the slip occurs in multiple locations, leading to plastic deformation of the crystal and finally the crystal collapse.

The above examples of the crystal collapse revealed that, a crystal having at least an oxygen concentration of $(12.0 \pm 2.5) \times 10^{17}$ atoms/cm$^3$(ASTM'79) involves a risk of collapse when the area having an internal stress larger than a threshold of $1.27 \times 10^4 \exp(10170/T)$ has a size equal to or larger than the crystal radius r, that is when the area is located r or more away from the crystal growth interface.

The threshold however varies depending on various conditions such as the concentration of impurities, simulation conditions, and the other conditions, as described above. When the threshold is lower, for example, a preferable size of the inversion area is 1.2 r rather than 1 r in some cases. The point here is that, when the area where the internal stress exceeds the threshold expressed as $\alpha \exp(\beta/T)$ is larger than a given size, the crystal collapse occurs.

As shown in FIGS. 4, 6, and 7, in the investigation under the above conditions, the threshold was $1.27 \times 10^4 \exp(10170/T)$, and it can be said that the boundary was 1 r.

Moreover, the respective growth conditions in FIGS. 4, 6, and 7 are investigated so that the correlation can be obtained.

(Preliminary Examination)

Preliminary examination of the growth conditions under which the crystal collapse does not occur is then conducted on the basis of the correlation obtained in the preliminary investigation. For the cases shown in FIGS. 4, 6, and 7, for example, the growth conditions are preliminarily examined such that the position away from the crystal growth interface at which the internal stress will exceed a threshold of $1.27 \times 10^4 \exp(10170/T)$ is within a crystal radius of 1 r. The growth conditions are determined in such a manner that the position at which the internal stress exceeds the threshold is sought by a simulation etc., under desired growth conditions to examine the probability of the collapse.

Exemplary parameters of the growth conditions include the position of the lower end of the cooling cylinder and the auxiliary cooling cylinder, as described above, and other proper conditions.

(Crystal Growth)

Next, a silicon single crystal is actually grown in accordance with the determined growth conditions. In this way, the crystal collapse, which unavoidably occurs in conventional operations, can be more reliably prevented; thereby the productivity and the yield can be improved.

In particular, a single crystal having a large diameter of 300 mm or more, further, 450 mm or more and the entire plane of N-region can be efficiently grown, although this type of crystal needs to be rapidly cooled to achieve rapid crystallization and the N-region and is relatively easy to give rise to the crystal collapse.

The determination of the growth conditions of and the growth of the silicon single crystal, when the N-region single crystal is manufactured, may be performed such that the conditions can not only prevent the crystal collapse but also achieve rapid cooling in which the temperature gradient G near the growth interface at the central portion of the crystal is 350/r (° C./mm) or more.

The ratio V/G of the crystal growth rate V to the temperature gradient G, as above, needs to fulfill a given condition to manufacture an N-region single crystal; a larger value of the temperature gradient G enables the growth rate V to be increased, enabling the—improvement in productivity. Also in rapid crystallization, a larger value of the temperature gradient G enables the growth rate V to be increased, enabling the improvement in productivity. The temperature gradient G in this embodiment may be a value determined within the range between the melting point of silicon (1412° C.) and 1400° C.

In addition, the present invention is effective in growing a crystal having a diameter of particularly 300 mm or more, because of the following reasons: since the interior of a crystal having a large diameter is difficult to cool, the stress is apt to be large to ensure the above temperature gradient G; and if the crystal collapse occurs, considerable damage may be sustained. The invention is extremely important in considering the crystal growth conditions particularly for a crystal having a diameter of 450 mm or more, which has not been mass-produced yet and will be developed and standardized in manufacture conditions for the future.

Moreover, in order to widen the margin for manufacture of an N-region single crystal, the silicon single crystal may be grown under the conditions determined such that the cooling rate is 0.96° C./min or more when the temperature is decreased from the melting point of silicon to 950° C., the cooling rate is 0.88° C./min or more when the temperature is decreased from 1150° C. to 1080° C., and the cooling rate is 0.71° C./min or more when the temperature is decreased from 1050° C. to 950° C.

Use of such conditions can shorten the transit time between 1150° C. and 1180° C., which is referred to as a temperature zone in which void defects of vacancy-type secondary defects are formed, thereby enabling the inhibition of the growth of the void defects.

Since the temperature at which OSF nuclei of vacancy-type secondary defects are formed is said to be about 1000° C., the increase in cooling rate in the temperature zone between 1050° C. and 950° C. enables the inhibition of the growth of the OSF nuclei.

The aggregation temperature of interstitial defects, on the other hand, is unclear, but considered to be in a high temperature zone because of the generation of the dislocation cluster. The increase in cooling rate in the temperature zone between the melting point and 950° C. is expected to enable the inhibition of the growth of the interstitial defects as well.

When the above rapid cooling conditions are fulfilled, the growth of the above defects can be inhibited and the margin for manufacture of an N-region single crystal can be widened.

EXAMPLE

The present invention will be more specifically described below with reference to examples and a comparative example, but the present invention is not limited these examples.

Example 1

The inventive method for growing a silicon single crystal was implemented. The growth conditions were examined by a simulation to grow a silicon single crystal having a diameter of 456 mm (a radius of 228 mm) and a straight-body length of about 80 cm with the CZ silicon single crystal manufacturing apparatus shown in FIG. 2.

The above preliminary investigation had already revealed that the position (inversion area) away from the crystal growth interface at which the internal stress in the crystal would exceed a threshold of $1.27 \times 10^4$ exp(10170/T) and at which the crystal collapse might occur was 1 r (228 mm), where T was a crystal temperature (K).

In view of this, a very large shielding member, as shown in FIG. 2, was used; and the hot zone (HZ) was prepared such that the lower end of the auxiliary cooling cylinder located 20 mm below the lower end of the cooling cylinder. This position of the lower end of the auxiliary cooling cylinder located 415 mm above the surface of the raw material melt and was larger than a crystal radius of 228 mm.

Figure 8:
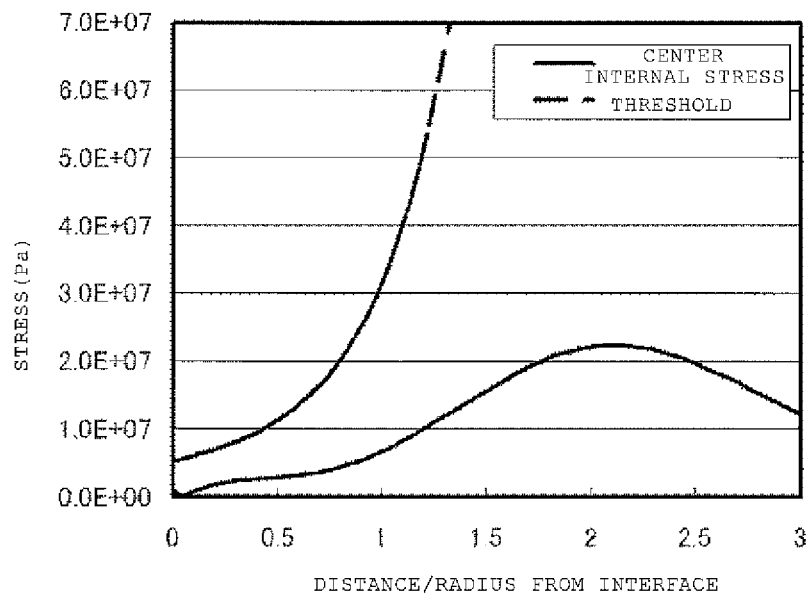
FIG. 8 are graphs on which axial distributions of internal stress in a crystal and a threshold in example 1 are plotted, where (a) shows a distribution of the center of the crystal and (b) shows a distribution of the periphery of the crystal.
Figure 8:
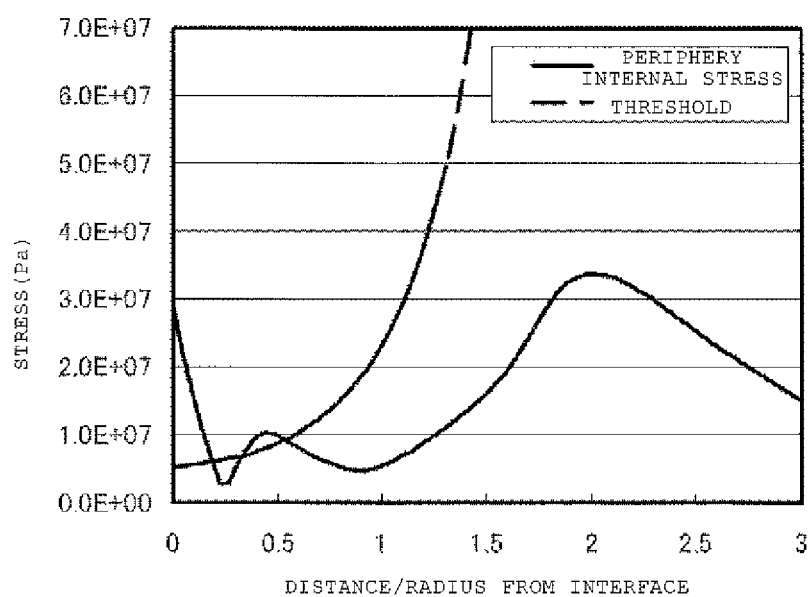

In the preliminary examination, the internal stress in the crystal was calculated under the fourth multi-pulling condition. FIG. 8 show the result, where FIG. 8(a) shows the result at the crystal center; FIG. 8(b) at the crystal periphery. The obtained calculation result was that the inversion area where the internal stress exceeded the threshold remained within 0.53 r.

Four silicon single crystals were then grown while fine adjustment of the growth conditions, more specifically, the growth rate and the distance between the shielding member and the melt surface, was repeated to obtain substantially the entire straight body of N-region except for crystal top and bottom sides.

The result was that, when the four crystals were grown, the generation of dislocations occurred five times, but none of the crystals were collapsed.

In all the crystals, however, the entire plane of N-region was not obtained, although a part in the plane became an N-region. This means that the margin for manufacture was not sufficient to obtain a single crystal having the entire plane of N-region.

Although the crystal collapse did not occur, the temperature gradient G between the melting point and 1400° C. at the central portion of the crystal was 1.44° C./mm and lower than 1.54° C./mm (350/r=350/228); this means that cooling was not sufficient to obtain a single crystal having the entire plane of N-region.

In addition, the cooling rates between the melting point and 950° C., 1150° C. and 1080° C., 1050° C. and 950° C. were calculated. The result was that the values at the central portion of the crystal were 0.50° C./min, 0.52° C./min, and 0.50° C./min for the above temperatures, respectively; this means that the margin for manufacture of a single crystal having the entire plane of N-region was not able to be secured.

Example 2

The inventive method for growing a silicon single crystal was implemented.

The following was changed from example 1: the HZ shown in FIG. 2, that is, the position of the lower end of the cooling cylinder and the auxiliary cooling cylinder was adjusted such that each position became identical; the shielding member was smaller; and they were located 160 mm above the surface of the raw material melt. This distance was equal to or shorter than a crystal radius of 228 mm.

Figure 9:
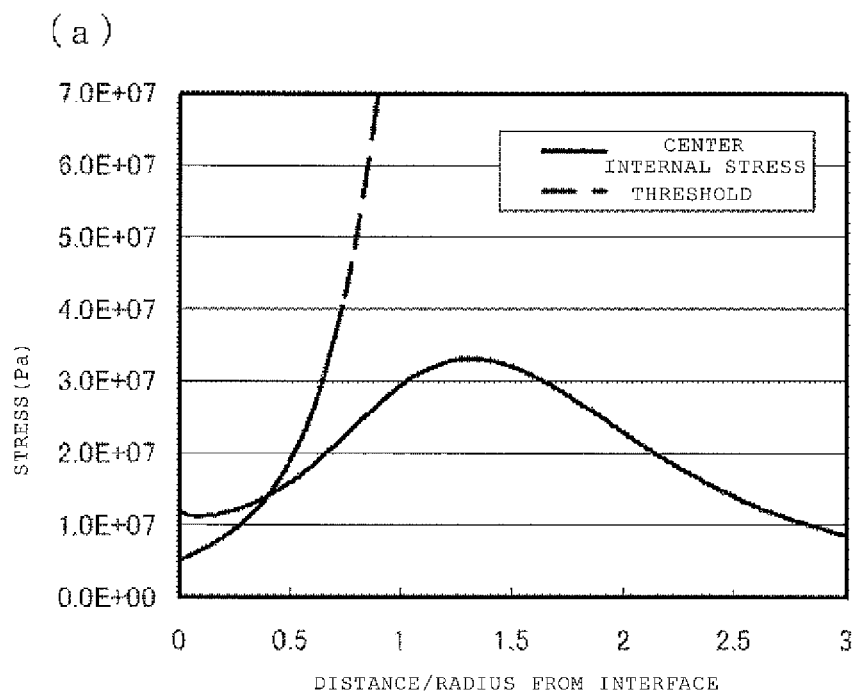
FIG. 9 are graphs on which axial distributions of internal stress in a crystal and a threshold in example 2 are plotted, where (a) shows a distribution of the center of the crystal and (b) shows a distribution of the periphery of the crystal.
Figure 9:
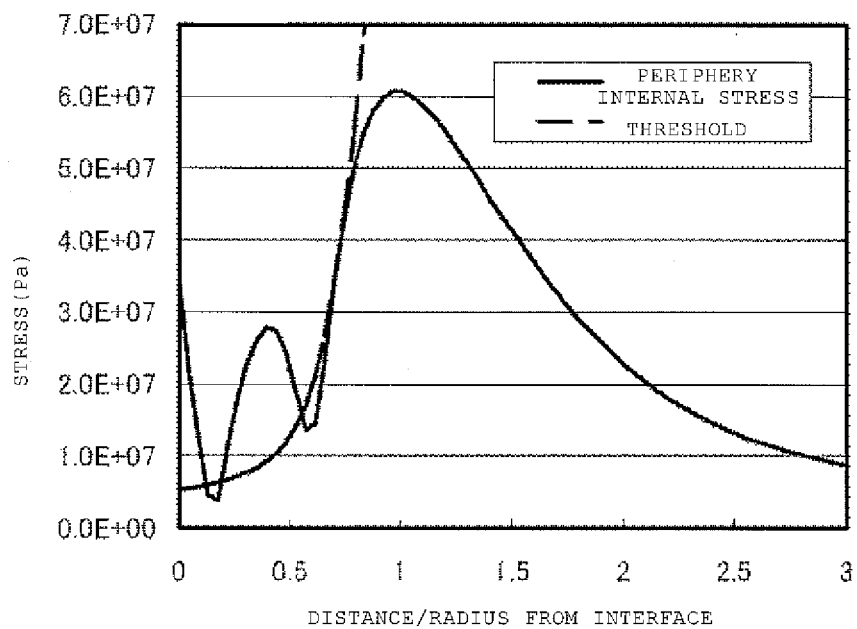

In the preliminary examination, the internal stress in the crystal was calculated under the fourth multi-pulling condition. FIG. 9 show the result, where FIG. 9(a) shows the result at the crystal center; FIG. 9(b) at the crystal periphery. The obtained calculation result was that the inversion area where the internal stress exceeded the threshold remained within 0.72 r.

The growth conditions were determined in the above manner to grow the silicon single crystal. A desired silicon single crystal was consequently obtained without crystal collapse.

After the growth conditions were determined so as to prevent crystal collapse, four silicon single crystals were grown while fine adjustment of the growth conditions, more specifically, the growth rate and the distance between the shielding member and the melt surface, was repeated to obtain substantially the entire straight body of N-region except for crystal top and bottom sides.

The result was that, when the four crystals were grown, the generation of dislocations occurred seven times, but none of the crystals were collapsed.

In addition, the fourth growth succeeded in growing a silicon single crystal having substantially the whole straight-body of N-region. Thus, a sufficient margin for manufacture of an N-region crystal was able to be secured.

The temperature gradient G between the melting point and 1400° C. at the central portion of the crystal was 2.23° C./mm and higher than 1.54° C./mm (350/r=350/228); this means that cooling was sufficient to obtain a single crystal having the entire plane of N-region.

In addition, the cooling rates between the melting point and 950° C., 1150° C. and 1080° C., 1050° C. and 950° C. were calculated. The result was that the values at the central portion of the crystal were 0.96° C./min, 0.97° C./min, and 0.89° C./rain, respectively; this means that the cooling rate was sufficient and the margin for manufacture of a single crystal having the entire plane of N-region was thereby able to be secured.

Referential Example 1

The cooling cylinder of the apparatus was disposed such that the distance between the cooling cylinder and the melt surface was shorter than that in example 1 and longer than that in example 2. The height position of the lower end of the cooling cylinder was identical to that of the auxiliary cooling cylinder and 290 mm away from the melt surface. This distance was longer than a crystal radius of 228 mm.

The preliminary examination was conducted by a simulation, where the internal stress was calculated. The inversion area where the calculated internal stress exceeded the threshold was spread up to 1.15 r and exceeded 1 r. Since there was thus a risk of crystal collapse if a crystal was grown under the conditions in this example, the growth of the crystal was canceled.

Comparative Example 1

A silicon single crystal having a diameter of 306 mm (a radius of 153 mm) was grown as in referential example 1 except that the chamber, the HZ size, and the diameter was reduced to about two thirds of those in referential example 1, because the collapse of a 450-mm-diameter crystal would cause severe damage.

The silicon single crystal was then pulled. When dislocations were generated or a step of forming a straight body was finished, the pulled crystal was melted again. This operation was repeated until the crystal collapse occurred; consequently the crystal was collapsed when the generation of the dislocations occurred ten times.

Figure 10:
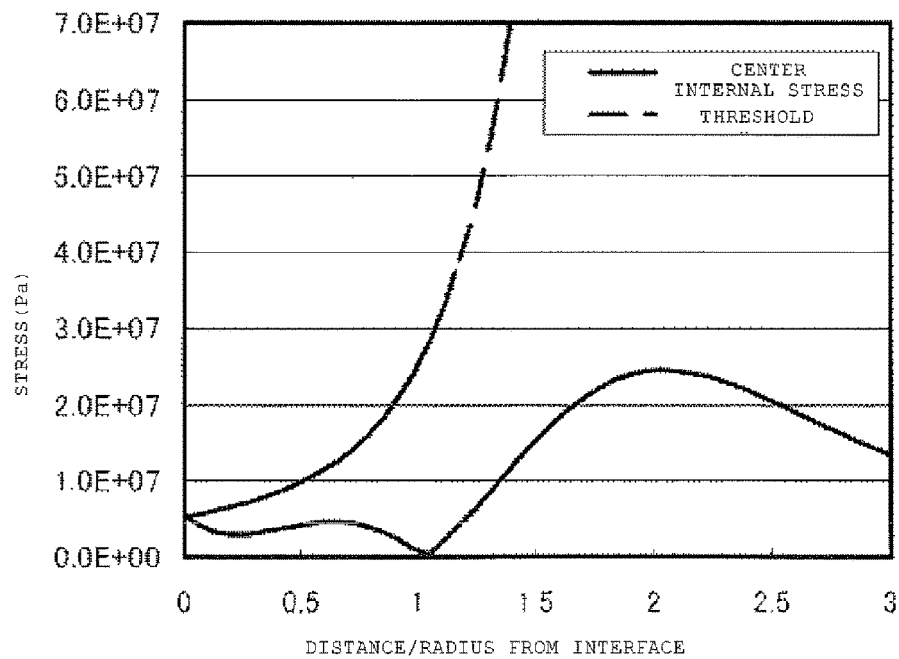
FIG. 10 are graphs on which axial distributions of internal stress in a crystal and a threshold in comparative example 1 are plotted, where (a) shows a distribution of the center of the crystal and (b) shows a distribution of the periphery of the crystal.
Figure 10:
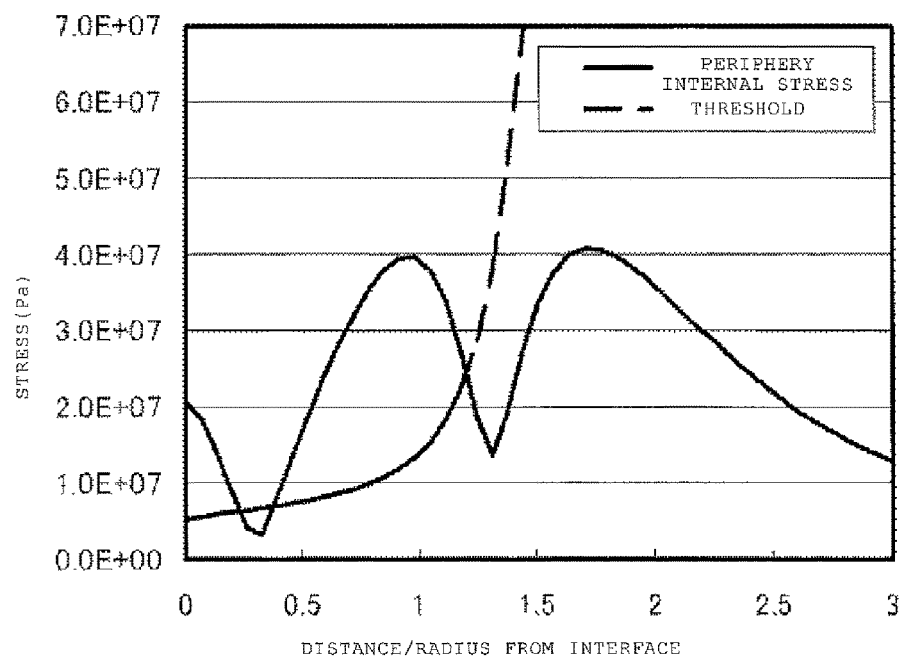

The result of the internal stress was similar to that of the 450-mm-dialer crystal in comparative example 1. FIG. 10 shows the calculation result of the internal stress. As seen in FIG. 10, the inversion area was spread up to 1.20 r and exceeded 1 r. It can be understood that the collapse occurred due to this wide inversion area.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for growing a silicon single crystal by a Czochralski method, comprising: conducting a preliminary examination of growth conditions under which crystal collapse does not occur, the preliminary examination being based on a correlation between presence or absence of the crystal collapse in the silicon single crystal and a position at which an internal stress in the crystal when the silicon single crystal is grown will exceed a prescribed threshold, the position being away from a crystal growth interface; and growing the silicon single crystal after adjusting the growth conditions based on the preliminary examination to prevent crystal collapse, wherein the silicon single crystal is grown with a growing apparatus comprising a cooling cylinder configured to surround the silicon single crystal and to forcibly cool the silicon single crystal with a cooling medium and an auxiliary cooling cylinder disposed so as to contact the cooling cylinder, the auxiliary cooling cylinder surrounding the silicon single crystal, and the growth conditions include a position of a lower end of at least one of the cooling cylinder and the auxiliary cooling cylinder, wherein the prescribed threshold is $1.27 \times 10^4 \exp(10170/T)$, where T is a crystal temperature (K).

2. The method for growing a silicon single crystal according to claim 1, wherein the silicon single crystal is grown while a temperature gradient (G) of a central portion of the crystal near the crystal growth interface is equal to or more than 350/r (K/mm), where r is a crystal radius.

3. The method for growing a silicon single crystal according to claim 1, wherein the silicon single crystal has a diameter of 300 mm or more.

4. The method for growing a silicon single crystal according to claim 2, wherein the silicon single crystal has a diameter of 300 mm or more.

5. The method for growing a silicon single crystal according to claim 1, wherein the cooling cylinder is made of a metal selected from a group consisting of iron, chromium, nickel, copper, titanium, molybdenum, and tungsten, or an alloy containing the metal, or the metal or the alloy coated with titanium, molybdenum, tungsten, or platinum metal.

6. The method for growing a silicon single crystal according to claim 1, wherein the auxiliary cooling cylinder is made of a metal selected from a group consisting of a graphite material, a carbon composite, stainless steel, molybdenum, and tungsten and has a slit that axially penetrates.

7. The method for growing a silicon single crystal according to claim 5, wherein the auxiliary cooling cylinder is made of a metal selected from a group consisting of a graphite material, a carbon composite, stainless steel, molybdenum, and tungsten and has a slit that axially penetrates.

8. The method for growing a silicon single crystal according to claim 1, wherein the silicon single crystal is grown in such a manner that a cooling rate is 0.96° C./min or more when the temperature is decreased from a melting point of silicon to 950° C., the cooling rate is 0.88° C./min or more when the temperature is decreased from 1150° C. to 1080° C., and the cooling rate is 0.71° C./min or more when the temperature is decreased from 1050° C. to 950° C.

9. The method for growing a silicon single crystal according to claim 7, wherein the silicon single crystal is grown in such a manner that a cooling rate is 0.96° C./min or more when the temperature is decreased from a melting point of silicon to 950° C., the cooling rate is 0.88° C./min or more when the temperature is decreased from 1150° C. to 1080° C., and the cooling rate is 0.71° C./min or more when the temperature is decreased from 1050° C. to 950° C.

10. The method for growing a silicon single crystal according to claim 1, wherein the preliminary examination comprises measuring, for a plurality of growth conditions, whether the position is located a predetermined distance away from the crystal growth interface.

11. The method for growing a silicon single crystal according to claim 10, wherein the predetermined distance is equal to or greater than the crystal radius.

* * * * *